(12) United States Patent
Kang

(10) Patent No.: US 9,048,377 B2
(45) Date of Patent: Jun. 2, 2015

(54) LIGHT EMITTING DEVICE, METHOD FOR FABRICATING THE LIGHT EMITTING DEVICE, LIGHT EMITTING DEVICE PACKAGE, AND LIGHTING UNIT

(75) Inventor: Gu Cheol Kang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 489 days.

(21) Appl. No.: 12/974,331

(22) Filed: Dec. 21, 2010

(65) Prior Publication Data

US 2011/0291134 A1    Dec. 1, 2011

(30) Foreign Application Priority Data

May 25, 2010  (KR) .................. 10-2010-0048597

(51) Int. Cl.
| | | |
|---|---|---|
| *H01L 33/00* | (2010.01) | |
| *H01L 33/20* | (2010.01) | |
| *H01L 33/22* | (2010.01) | |
| *H01L 33/38* | (2010.01) | |
| *H01L 33/40* | (2010.01) | |
| *H01L 33/44* | (2010.01) | |

(52) U.S. Cl.
CPC ............ *H01L 33/20* (2013.01); *H01L 33/0079* (2013.01); *H01L 33/22* (2013.01); *H01L 33/38* (2013.01); *H01L 33/405* (2013.01); *H01L 33/44* (2013.01); *H01L 2924/0002* (2013.01); *H01L 2224/48091* (2013.01); *H01L 2224/48247* (2013.01)

(58) Field of Classification Search
CPC .............................................. H01L 2933/0016
USPC .................................................. 257/98–100
See application file for complete search history.

(56) References Cited

U.S. PATENT DOCUMENTS

| | | |
|---|---|---|
| 4,966,862 A | 10/1990 | Edmond |
| 7,368,756 B2 | 5/2008 | Bruhns et al. |
| 8,033,707 B2 | 10/2011 | Kim et al. |
| 8,058,147 B2 | 11/2011 | Herrmann et al. |
| 2005/0017258 A1 | 1/2005 | Fehrer et al. |
| 2006/0097274 A1 | 5/2006 | Lee et al. |
| 2007/0187702 A1 | 8/2007 | Lee et al. |
| 2007/0295952 A1 | 12/2007 | Jang et al. |
| 2008/0113462 A1 | 5/2008 | Kim et al. |
| 2009/0026490 A1* | 1/2009 | Kim et al. ................ 257/103 |
| 2010/0065872 A1 | 3/2010 | Lee |

(Continued)

FOREIGN PATENT DOCUMENTS

| | | |
|---|---|---|
| CN | 1679144 A | 10/2005 |
| CN | 101238593 A | 8/2008 |
| CN | 101418931 A | 4/2009 |

(Continued)

*Primary Examiner* — Samuel Gebremariam
(74) *Attorney, Agent, or Firm* — McKenna Long & Aldridge LLP

(57) ABSTRACT

Provided are a light emitting device, a method for fabricating the light emitting device, a light emitting device package, and a lighting unit. The light emitting device includes a support member having a stepped portion on a side surface, a light emitting structure on the support member, the light emitting structure including a first conductive type semiconductor layer, an active layer, and a second conductive type semiconductor layer to generate light, and an electrode supplying a power to the first conductive type semiconductor layer. The support member has a first surface on which the light emitting structure is disposed and a second surface having an area greater than that of the first surface.

18 Claims, 12 Drawing Sheets

(56) References Cited

U.S. PATENT DOCUMENTS

2010/0123147 A1 5/2010 Jeong
2011/0128980 A1 6/2011 Kato

FOREIGN PATENT DOCUMENTS

| EP | 2246908 | A2 | 3/2010 |
|----|---------|----|--------|
| JP | 2008198845 | A | 8/2008 |
| KR | 2004-0090456 | A | 10/2004 |
| KR | 10-2006-0041383 | A | 5/2006 |
| KR | 10-2010-0051933 | A | 5/2010 |

\* cited by examiner

12 # LIGHT EMITTING DEVICE, METHOD FOR FABRICATING THE LIGHT EMITTING DEVICE, LIGHT EMITTING DEVICE PACKAGE, AND LIGHTING UNIT

CROSS-REFERENCE TO RELATED APPLICATIONS

The present application claims priority under 35 U.S.C. 119 and 35 U.S.C. 365 to Korean Patent Application No. 10-2010-0048597 (filed on May 25, 2010), which is hereby incorporated by reference in its entirety.

BACKGROUND OF THE INVENTION

Embodiments relate to a light emitting device, a method for fabricating the light emitting device, a light emitting device package, and a lighting unit.

A light emitting diode (LED) is a kind of a semiconductor device for converting electric energy into light. The LED has advantages such as low power consumption, a semi-permanent life cycle, a fast response time, safety, and environment friendly compared to the related art light source such as a fluorescent lamp and an incandescent bulb. Many studies are being in progress in order to replace the related art light source with an LED. Also, the LED is being increasingly used according to the trend as light sources of a lighting device such as a variety of lamps and streetlights, a lighting unit of a liquid crystal display device, and a scoreboard in indoor and outdoor places.

SUMMARY OF THE INVENTION

Embodiments provide a light emitting device having a new structure, a method for fabricating the light emitting device, a light emitting device package, and a lighting unit.

Embodiments also provide a light emitting device having improved reliability, a method for fabricating the light emitting device, a light emitting device package, and a lighting unit.

In one embodiment, a light emitting device includes: a support member having a stepped portion on a side surface; a light emitting structure on the support member, the light emitting structure including a first conductive type semiconductor layer, an active layer, and a second conductive type semiconductor layer to generate light; and an electrode supplying a power to the first conductive type semiconductor layer, wherein the support member has a first surface on which the light emitting structure is disposed and a second surface having an area greater than that of the first surface.

In another embodiment, a method for fabricating a light emitting device includes: sequentially forming a first conductive type semiconductor layer, an active layer, and a second semiconductor layer to form a light emitting structure; forming a support member on a top surface of the light emitting structure; performing an isolation etching process on the light emitting structure along a chip boundary region to divide the light emitting structure into individual light emitting device units; performing an etch process between the light emitting structures separated into the individual light emitting device units to remove at least portion of the support member; and performing a laser scribing process along the chip boundary region to separate a plurality of light emitting devices into individual light emitting device units.

In further another embodiment, a light emitting device package includes: a body; first and second electrode layers on the body; and a light emitting device electrically connected the first and second electrode layers to generate light, wherein the light emitting device includes: a support member having a stepped portion on a side surface; a light emitting structure on the support member, the light emitting structure including a first conductive type semiconductor layer, an active layer, and a second conductive type semiconductor layer to generate light; and an electrode supplying a power to the first conductive type semiconductor layer, wherein the support member has a first surface on which the light emitting structure is disposed and a second surface having an area greater than that of the first surface.

In still further another embodiment, a lighting unit includes: a module substrate; and a plurality of light emitting devices mounted on the module substrate, wherein each of the plurality of light emitting device includes a support member having a stepped portion on a side surface; a light emitting structure on the support member, the light emitting structure including a first conductive type semiconductor layer, an active layer, and a second conductive type semiconductor layer to generate light; and an electrode supplying a power to the first conductive type semiconductor layer, wherein the support member has a first surface on which the light emitting structure is disposed and a second surface having an area greater than that of the first surface.

The details of one or more embodiments are set forth in the accompanying drawings and the description below. Other features will be apparent from the description and drawings, and from the claims.

DETAILED DESCRIPTION OF THE EMBODIMENTS

Figure 1:
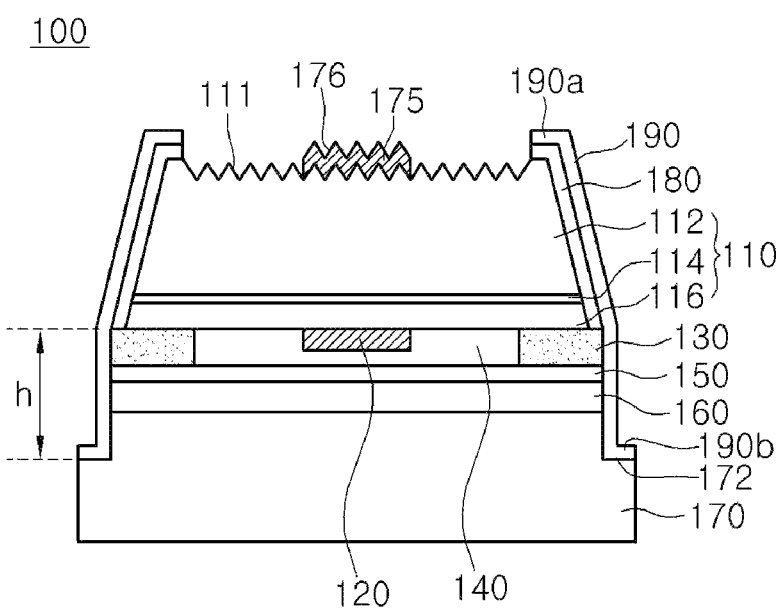
FIG. 1 is a side-sectional view of a light emitting device according to an embodiment.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device, a method for fabricating the light emitting device, a light emitting device package, and a lighting unit according to an embodiment will be described with reference to accompanying drawings.

FIG. 1 is a side-sectional view of a light emitting device according to an embodiment.

Referring to FIG. 1, a light emitting device 100 according to an embodiment may include a conductive support member 170 having a stepped portion 172 on a side surface thereof, a junction layer 160 on the conductive support member 170, a reflective layer 150 on the junction layer 160, a channel layer 130 around a top surface of the reflective layer 150, an ohmic layer 140 on the reflective layer 150, a light emitting structure 110 disposed on the ohmic layer 140 and the channel layer 130 to generate light, a first passivation layer 180 on a side surface of the light emitting structure 110, a second passivation layer 190 on side surfaces of the light emitting structure 110 and the conductive support member 170, and an electrode 175 on the light emitting structure 110.

The conductive support member 170 may support the light emitting structure 110. Also, the conductive support member 170 together with the electrode 175 may provide a power to the light emitting device 100. For example, the conductive support member 170 may be formed of at least one of Cu, Au, Ni, Mo, Cu—W, and a carrier wafer (e.g., Si, Ge, GaAs, ZnO, SiC, SiGe, or etc,).

The conductive support member 170 may have a sufficient thickness, for example, a thickness of about 50 µm to about 500 µm to support the light emitting structure 110.

Also, the stepped portion 172 may be disposed on a side surface of the conductive support member 170. Since the stepped portion 172 is provided, damage of the light emitting structure 110 by energy of a laser used in a laser scribing process through which a plurality of light emitting devices is separated into individual device units may be minimized.

For this, the stepped portion 172 may be spaced from a bottom surface of the light emitting structure 110 by a first distance h having a height of about 60 µm to about 120 µm. That is, since the laser energy is concentrated onto a top surface of the stepped portion 172 in the laser scribing process, an impact by the laser may be transferred onto the light emitting structure 110 spaced the first distance h from the stepped portion 172. This may be described in detail in a method for fabricating the light emitting device according to an embodiment.

The junction layer 160 may be disposed on the conductive support member 170. The junction layer 160 may be disposed to improve an adhesion of an interface between the conductive support member 170 and the reflective layer 150.

Although the conductive support member 170 is described as an example in the embodiment, the present disclosure is not limited to the conductive support member. For example, a non-conductive support member may be applicable. In this case, a through-hole for electrical connection may be defined inside or outside the support member. Also, although a vertical type chip structure is described as an example, the present disclosure is not limited thereto. For example, a lateral type chip or a flip type chip may be applicable.

The junction layer 160 may be formed of a metal material having superior adhesion, for example, at least one of Ti, Au, Sn, Ni, Cr, Ga, In, Bi, Cu, Ag, and Ta. The junction layer 160 may have a single- or multi-layered structure. However, when the conductive support member 170 is formed using a plating or deposition process, but a bonding process, the junction layer 160 may not be provided.

The reflective layer 150 may be disposed on the junction layer 160. The reflective layer 150 may reflect light incident from the light emitting structure 110 to improve light efficiency of the light emitting device 100.

The reflective layer 150 may be formed of a metal material having high reflectance, for example, at least one metal of Ag, Al, Pd, Cu, and Pt, or alloys thereof.

The channel layer 130 may be disposed in a circumference region of a top surface of the reflective layer 150, i.e., a circumference region between the reflective layer 150 and the light emitting structure 110. The channel layer 130 may prevent the light emitting structure 110 and the conductive support member 170 from being electrically short-circuited to each other and prevent moisture from being permeated between the light emitting structure 110 and the conductive support member 170.

The channel layer 130 may be formed of oxide or nitride, for example, at least one of $SiO_2$, $Si_xO_y$, $Si_3N_4$, $Si_xN_y$, $SiO_xN_y$, $Al_2O_3$, $TiO_2$, ITO, AZO, and ZnO.

The channel layer 130 may be formed of a metal material having conductivity and superior adhesion, for example, at least one of Ti, Ni, Pt, Pd, Rh, Ir, and W. In this case, the channel layer 130 may prevent reliability of the light emitting device 100 from being deteriorated due to exfoliation of the interface between the light emitting structure 110 and the reflective layer 150.

The ohmic layer 140 may be disposed on the reflective layer 150. The ohmic layer 140 may be disposed to realize ohmic-contact between the reflective layer 150 and the light emitting structure 110.

The ohmic layer 140 may selectively use a light-transmitting conductive layer and a metal. The ohmic layer 140 may have a single- or multi-layered structure. The ohmic layer 140 may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, Ni, Ag, and Au.

When the reflective layer 150 ohmic-contacts the light emitting structure 110, the ohmic layer 140 may not be provided.

A current blocking layer 120 may be disposed between the ohmic layer 140 and the light emitting structure 110.

At least portion of the current blocking layer 120 vertically overlaps the electrode 175. Also, the current blocking layer formed of a material having conductivity or insulativity less than that of the reflective layer 150 or the junction layer 160 or a material, which schottky-contacts a second conductive type semiconductor layer 116. For example, the current blocking layer 120 may be formed of at least one of ZnO, $SiO_2$, $SiO_x$, $SiO_xN_y$, $Si_3N_4$, $Al_2O_3$, $TiO_x$, Ti, Al, and Cr.

The current blocking layer 120 may prevent a current from concentrately flowing into the shortest distance between the conductive support member 170 and the electrode 175 to improve the light efficiency of the light emitting device 100.

The light emitting structure 110 may be disposed on the ohmic layer 140 and the channel layer 130.

The light emitting structure 110 may include a plurality of compound semiconductor layers. For example, the light emitting structure 110 may include a second conductive type semiconductor layer 116, an active layer 114 on the second conductive type semiconductor layer 116, and a first conductive type semiconductor layer 112 on the active layer 114.

For example, the second conductive type semiconductor layer 116 may be realized as a P-type semiconductor layer. The P-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, AlInN, InGaN, AlN, and InN. The P-type semiconductor layer may be doped with a P-type dopant such as Mg, Zn, Ca, Sr, or Ba.

For example, the active layer 114 may be formed of a semiconductor material having a compositional formula of $In_xAl_yGa_{1-x-y}N$ ($0 \leq x \leq 1$, $0 \leq y \leq 1$, $0 \leq x+y \leq 1$). Also, the active layer 114 may have one of a single quantum well structure, a multi quantum well (MQW) structure, a quantum wire structure, and a quantum dot structure.

When the active layer 114 may have the quantum well structure, the active layer 114 may have a single or quantum well structure including a well layer having a compositional formula of $In_xAl_yGa_{1-x-y}N$ ($0 \leq x \leq 1$, $0 \leq y \leq 1$, $0 \leq x+y \leq 1$) and a barrier layer having a compositional formula of $In_aAl_bGa_{1-a-b}N$ ($0 \leq a \leq 1$, $0 \leq b \leq 1$, $0 \leq a+b \leq 1$). The well layer may be formed of a material having an energy band gap less than that of the barrier layer.

The active layer 114 may generate light using energy generated by recombination of electrons and holes provided from the first conductive type semiconductor layer 112 and the second conductive type semiconductor layer 116.

For example, the first conductive type semiconductor layer 112 may include an N-type semiconductor layer. The N-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, AlInN, InGaN, AlN, and InN. The N-type semiconductor layer may be doped with an N-type dopant such as Si, Ge, or Sn.

A light extraction pattern 111 may be disposed on a top surface of the first conductive type semiconductor layer 112. The light extraction pattern 111 may have a random roughness shape or a regular shape.

For example, the light extraction pattern 111 may have a photonic crystal structure in which light having a specific wavelength band is selectively transmitted or reflected and have a period of about 50 nm to about 3000 nm, but is not limited thereto.

A conductive type semiconductor layer different from the second conductive type semiconductor layer 116 may be disposed below the second conductive type semiconductor layer 116. Also, the first conductive type semiconductor layer 112 may be realized as a P-type semiconductor layer, and the second conductive type semiconductor layer 116 may be realized as an N-type semiconductor layer. Thus, the light emitting structure 110 may has at least one of an N-P junction structure, a P-N junction structure, an N-P-N junction structure, and a P-N-P junction structure, but is not limited thereto.

The first passivation layer 180 may be disposed on a side surface of the light emitting structure 110. For example, the first passivation layer 180 may have one end disposed on a top surface of the light emitting structure 110 and the other end disposed on a top surface of the channel layer 130 along the side surface of the light emitting structure 110, but is not limited thereto.

The second passivation layer 190 may be disposed on side surfaces of the light emitting structure 110 and the conductive support member 170. Specifically, the second passivation 190 may be disposed outside the first passivation 180, the channel layer 130, the reflective layer 140, the junction layer 150, and the conductive support member 170.

The second passivation layer 190 may have one end 190a disposed on the top surface of the light emitting structure 110 and the other end 190b disposed on the stepped portion 172 of the conductive support member 170 along side surfaces of the light emitting structure 110 and the conductive support member 170, but is not limited thereto.

The first and second passivation layers 180 and 190 may prevent the light emitting structure 110 from being electrically short-circuited to an external electrode. Each of the first and second passivation layers 180 and 190 may be formed of oxide or nitride, e.g., one of $SiO_2$, $SiO_x$, $SiO_xN_y$, $Si_3N_4$, and $Al_2O_3$, but is not limited thereto. Here, the first and second passivation layers 189 and 190 may be formed of the same material as each other, but is not limited thereto.

Also, the second passivation layer 190 may prevent the light emitting structure 110 and the structures disposed below the reflective layer 150 from being exfoliated from each other.

The electrode 175 may be disposed on the first conductive type semiconductor layer 112 of the light emitting structure 110. For example, the electrode 175 may be formed of at least one of Au, Ti, Cu, Ni, and Cr, and have a single- or multi-layered structure, but is not limited thereto.

The light extraction pattern 111 on the first conductive type semiconductor layer 112 may be transferred onto a top surface of the electrode 175 to form a roughness 176.

Although the electrode 175 is disposed on the top surface of the light emitting structure 110 in the current embodiment, the present disclosure is not limited thereto. For example, a hybrid structure formed inside the light emitting structure may be applicable to the electrode.

Hereinafter, a method for fabricating the light emitting device 100 will be described in detail. The explanations duplicated with the aforementioned embodiment will be omitted.

FIGS. 2 to 11 are views illustrating a process for fabricating the light emitting device 100 according to an embodiment.

Figure 2:
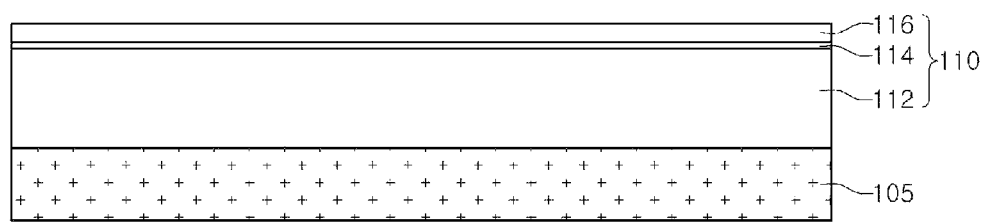
FIGS. 2 to 11 are views illustrating a process for fabricating the light emitting device of FIG. 1.

Referring to FIG. 2, a light emitting structure 110 may be formed on a substrate 105.

For example, the substrate 105 may be formed of at least one of sapphire ($Al_2O_3$), SiC, GaAs, GaN, ZnO, Si, GaP, InP, Ge, and $Ga_2O_3$, but is not limited thereto.

A second conductive type semiconductor layer 112, an active layer 114, and a first conductive type semiconductor layer 116 may be sequentially grown on the substrate 105 to form the light emitting structure 110.

For example, the light emitting structure 110 may be formed using one of a metal organic chemical vapor deposition (MOCVD) process, a chemical vapor deposition (CVD) process, a plasma-enhanced chemical vapor deposition (PECVD) process, a molecular beam epitaxy (MBE) process, and a hydride vapor phase epitaxy (HVPE) process, but is not limited thereto.

A buffer layer (not shown) may be further formed between the first conductive type semiconductor layer 112 and the substrate 105 to reduce a lattice constant difference therebetween.

Figure 3:
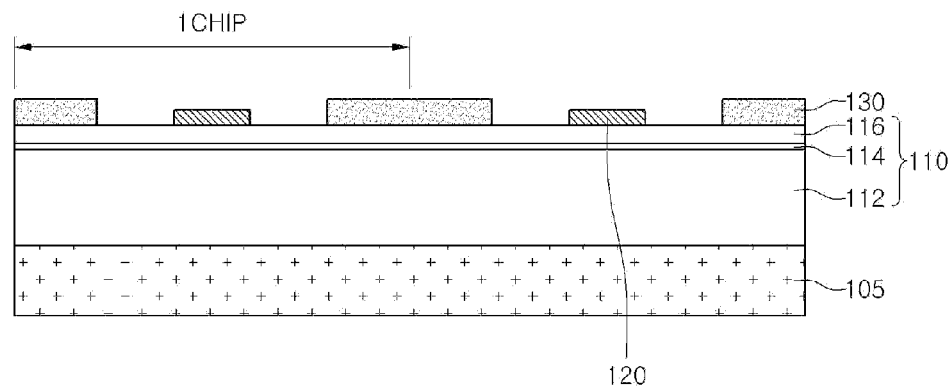

Referring to FIG. 3, a channel layer 130 and a current blocking layer 120 may be formed on a top surface of the light emitting structure 110.

The channel layer 130 may be formed in a boundary region of a unit chip (1 chip) using a mask pattern. The channel layer 130 may have a ring shape (closed shape), a loop shape, or a frame shape. For example, the channel layer 130 may be formed using at least one of an E-beam deposition process, a sputtering process, and a plasma enhanced chemical vapor deposition (PECVD) process.

At least one the current blocking layer 120 may vertically overlap the electrode 175 that will be formed later). The current blocking layer 120 may be formed using a deposition or plating process.

Figure 4:
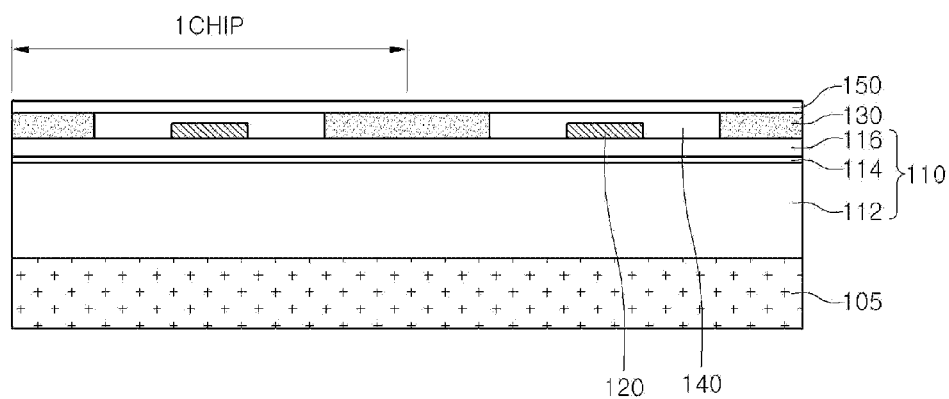

Referring to FIG. 4, an ohmic layer 140 may be formed on the second conductive type semiconductor layer 116, and a reflective layer 150 may be formed on the ohmic layer 140 and the channel layer 130.

The ohmic layer 140 and the reflective layer 150 may be formed using at least one deposition process of an E-beam deposition process, a sputtering process, and a plasma enhanced chemical vapor deposition (PECVD) process or a plating process, but is not limited thereto.

Figure 5:
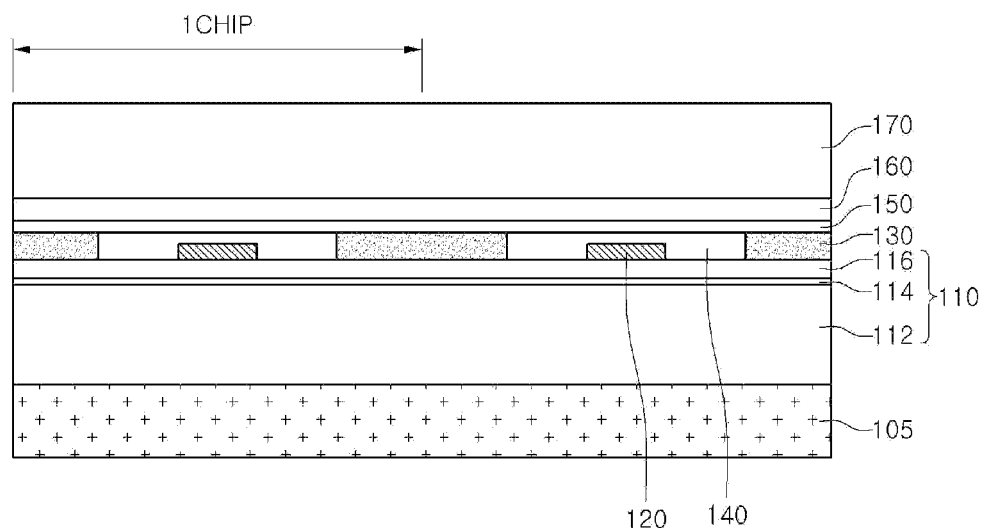

Referring to FIG. 5, a junction layer 160 may be formed on the reflective layer 150, and a conductive support member 170 may be formed on the junction layer 160.

The conductive support member 170 may be firmly bonded by the junction layer 160. When the conductive support member 170 is formed using the deposition or plating process, the junction layer 160 may be not formed.

Figure 6:
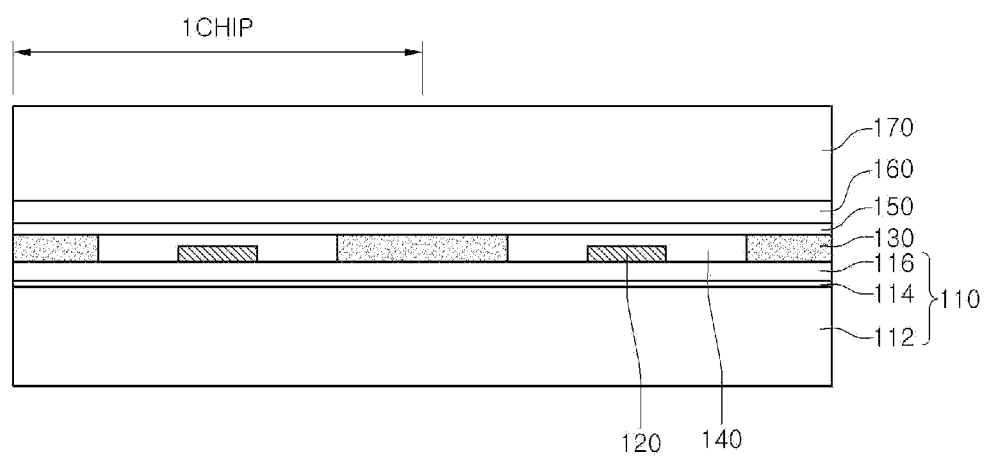

Referring to FIGS. 5 and 6, the substrate 105 may be removed. The substrate 105 may be removed by at least one of a laser lift off (LLO) method, a chemical lift off (CLO) method, and a physical polishing method.

The LLO method is a process in which a laser is irradiated onto the substrate through a back surface of the substrate 105 to exfoliate an interface between the substrate 105 and the first conductive type semiconductor layer 112.

The CLO method is a process for removing the substrate 105 using an etchant. The physical polishing method is a process for physically polishing the substrate 105.

As the substrate 105 is removed, an under surface of the first conductive type semiconductor layer 112 may be exposed.

Figure 7:
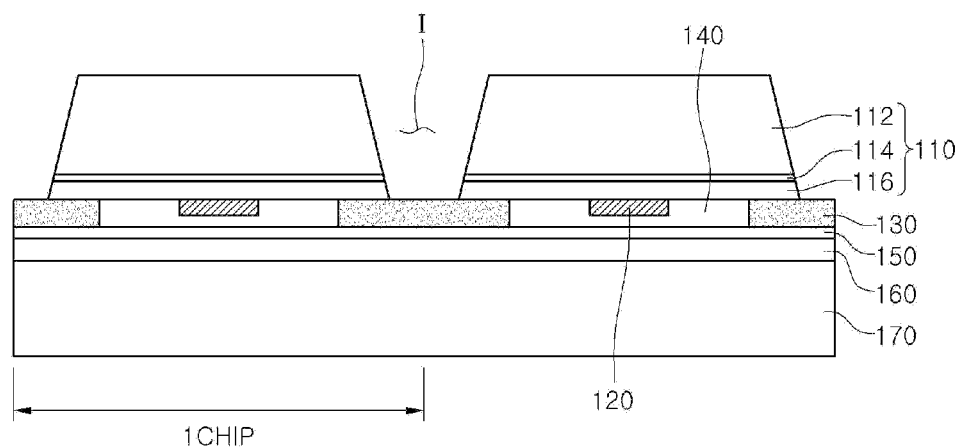

Referring to FIG. 7, an isolation etching process may be performed on the light emitting structure 110 along a chip boundary region I to separate the light emitting structure 110 of the plurality of light emitting devices into individual light emitting device units. However, for convenience of description, a structure in which the light emitting device described in the fabrication process of FIG. 6 turns upside down will be described.

For example, the isolation etching process may be performed by a dry etch process such as an inductively coupled plasma (ICP) process.

Figure 8:
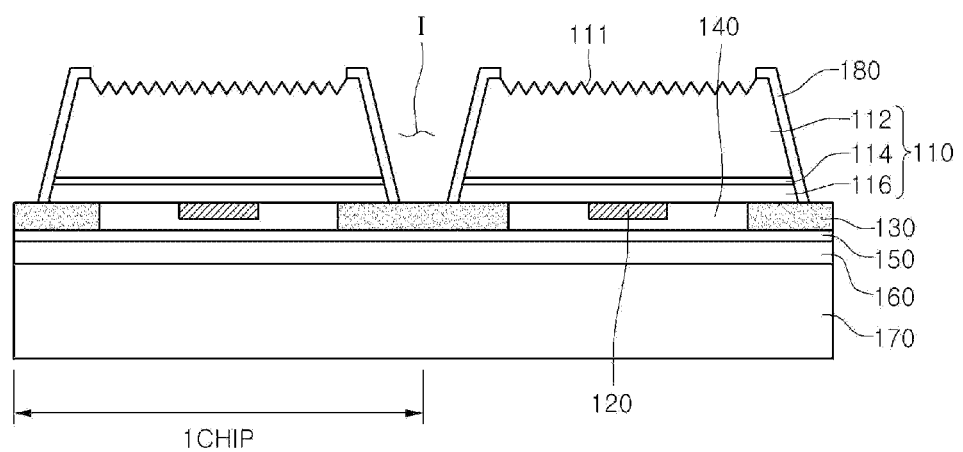

Referring to FIG. 8, a passivation layer 180 may be formed on a side surface of the light emitting structure 110.

The first passivation layer 180 may be formed using at least one deposition process of an E-beam deposition process, a sputtering process, and a plasma enhanced chemical vapor deposition (PECVD) process or a plating process, but is not limited thereto.

After the first passivation layer 180 is formed, a light extraction pattern 111 may be formed on the first conductive type semiconductor layer 112. The light extraction pattern 111 may have a random shape by a wet etch process or a photonic crystal structure along a mask pattern, but is not limited thereto.

The light extraction pattern 111 may be previously formed before the first passivation layer 180 is formed, but is not limited thereto.

Figure 9:
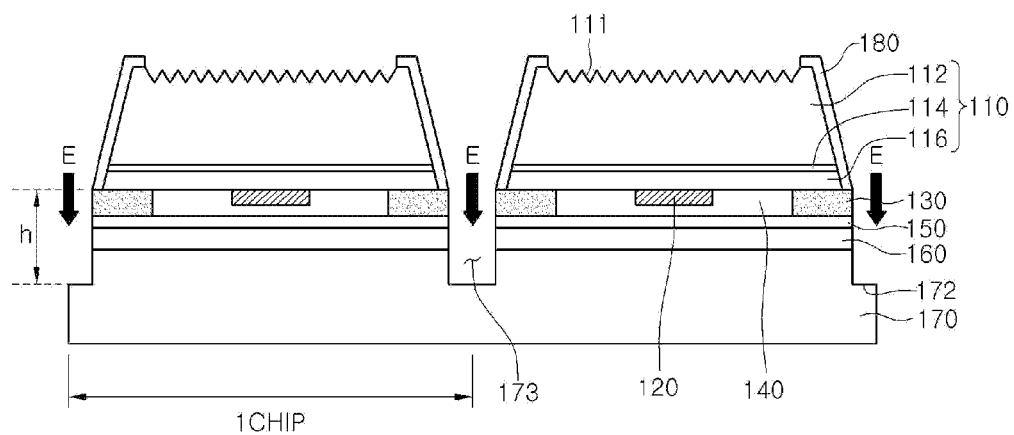

Referring to FIG. 9, an etch process may be performed between the light emitting structures 110 divided into the individual light emitting device unit.

A portion of the channel layer 130, the reflective layer 150, the junction layer 160, and the conductive support member 170 may be removed by the etch process to form a groove 173, and a stepped portion 172 is formed on a side surface of the conductive support member 170. That is, the stepped portion 172 may be formed on a circumference region of the light emitting device 100 according to an embodiment along a chip boundary region.

The top surface of the stepped portion 172 may be spaced from a bottom surface of the light emitting structure 110 by a first distance h. The first distance h may be about 60 μm to about 120 μm.

The etch process may include a wet etch process or a dry etch process, e.g., a dry etch process using inductively couple plasma (ICP).

When the etch process is performed by the wet etch process that is an isotropic etch process, the channel layer 130, the reflective layer 150, the junction layer 160, and the conductive support member 170 may have curved side surfaces.

Figure 10:
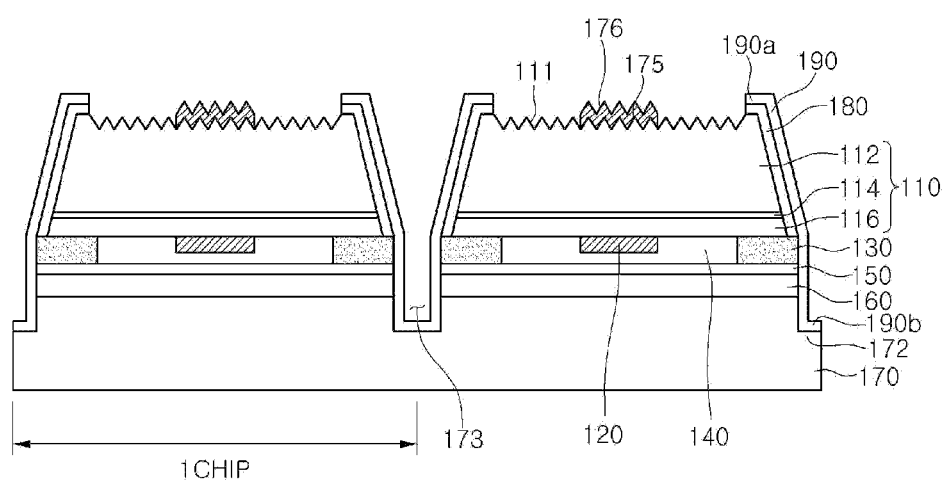

Referring to FIG. 10, an electrode 175 may be formed on the first conductive type semiconductor layer 112. The electrode 175 may be formed using a plating or deposition process.

A second passivation layer 190 may be formed on side surfaces of the light emitting structure 110 and the conductive support member 170. Specifically, the second passivation 190 may be formed outside the first passivation layer 180, the channel layer 130, the reflective layer 140, the junction layer 150, and the conductive support member 170.

The second passivation layer 190 may have one end 190a disposed on a top surface of the light emitting structure 110 and the other end 190b disposed on the stopped portion 172 of the conductive support member 170 along the side surface of the light emitting structure 110, but is not limited thereto.

Figure 11:
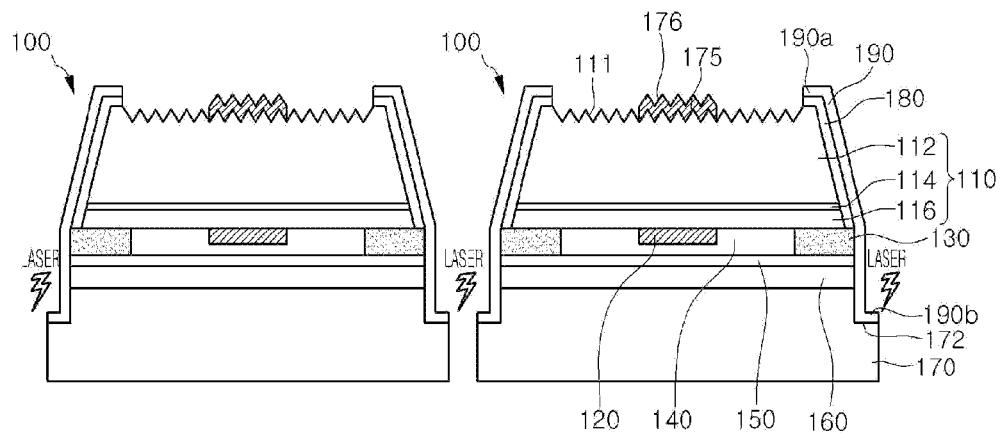

Referring to FIGS. 10 and 11, a chip separation process using a laser scribing process may be performed along the stepped portion 172 to separate the plurality of light emitting devices into individual light emitting device units, thereby providing the light emitting device 100 according to an embodiment.

The laser scribing process is a process in which a laser is irradiated along a chip boundary to separate the chip into unit chips.

In the current embodiment, according to the laser scribing process, since the laser is irradiated onto the stepped portion 172 spaced from the light emitting structure 110 by the first distance h, damage of the light emitting structure 110 due to laser energy in the laser scribing process may be minimized.

Also, according to the laser scribing process, the chip separation process may be quickly performed to improve efficiency of the fabrication process.

Figure 12:
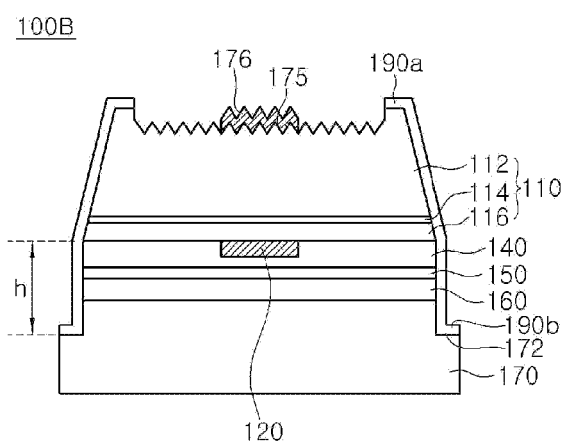
FIG. 12 is a side-sectional view of a light emitting device according to another embodiment.

FIG. 12 is a side-sectional view of a light emitting device 100B according to another embodiment.

Referring to FIG. 12, the light emitting device 100B may have the same structure as the light emitting device 100 of FIG. 1 except existence and inexistence of the channel layer and the first passivation layer.

That is, a light emitting device 100B may include a conductive support member 170 having a stepped portion 172 on a side surface thereof, a junction layer 160 on the conductive support member 170, a reflective layer 150 on the junction layer 160, an ohmic layer 140 on the reflective layer 150, a light emitting structure 110 disposed on the ohmic layer 140 to generate light, a passivation layer 190 on side surfaces of the light emitting structure 110 and the conductive support member 170, and an electrode 175 on the light emitting structure 110.

In the light emitting device 100B, a channel layer is not separately manufactured. That is, the conductive support member 170, the junction layer 160, the reflective layer 150, and the ohmic layer 140 may be selectively removed along a chip boundary region to manufacture the channel layer.

FIGS. 13 to 20 are views illustrating a process for fabricating the light emitting device 100B of FIG. 12. In descriptions of a fabrication method of the light emitting device 100B, the explanations duplicated with the aforementioned embodiment will be omitted or simply described.

Figure 13:
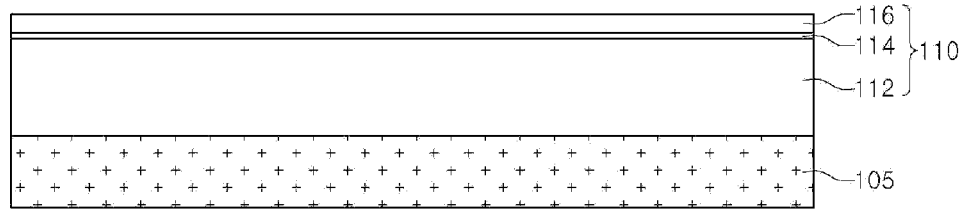
FIGS. 13 to 20 are views illustrating a process for fabricating the light emitting device of FIG. 12.

Referring to FIG. 13, a light emitting structure 110 may be formed on a substrate 105. A first conductive type semiconductor layer 112, an active layer 114, and a second conductive type semiconductor layer 116 may be sequentially grown on the substrate 105 to form the light emitting structure 110.

Figure 14:
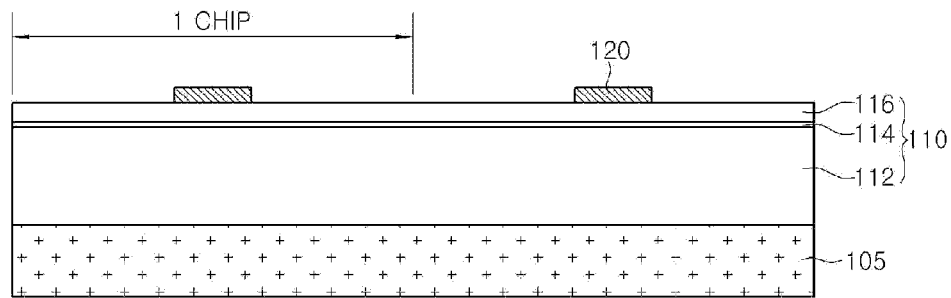

Referring to FIG. 14, a current blocking layer 120 may be formed on a top surface of the light emitting structure 110.

At least one of the current blocking layer 120 may vertically overlap an electrode 175 that will be formed later. The current blocking layer 120 may be formed using a deposition or plating process.

Figure 15:
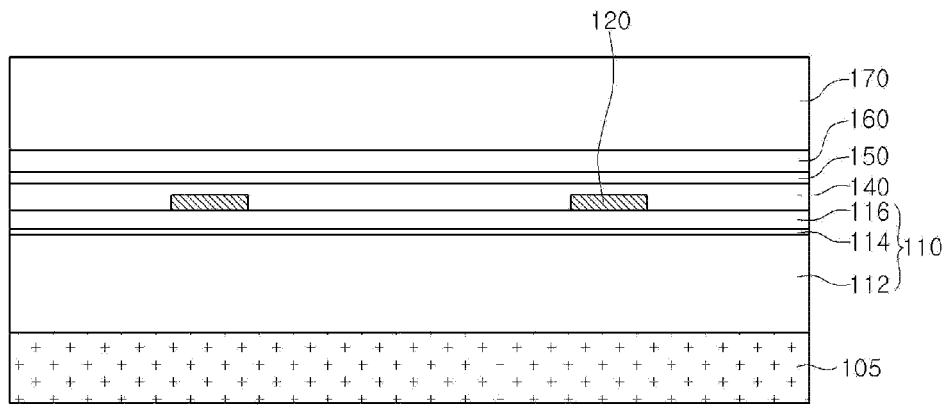

Referring to FIG. 15, an ohmic layer 140 may be formed on the second conductive type semiconductor layer 116 and the current blocking layer 120, a reflective layer 150 may be formed on the ohmic layer 140, and a junction layer 160 may be formed on the reflective layer 150, and a conductive support member 170 may be formed on the junction layer 160.

Figure 16:
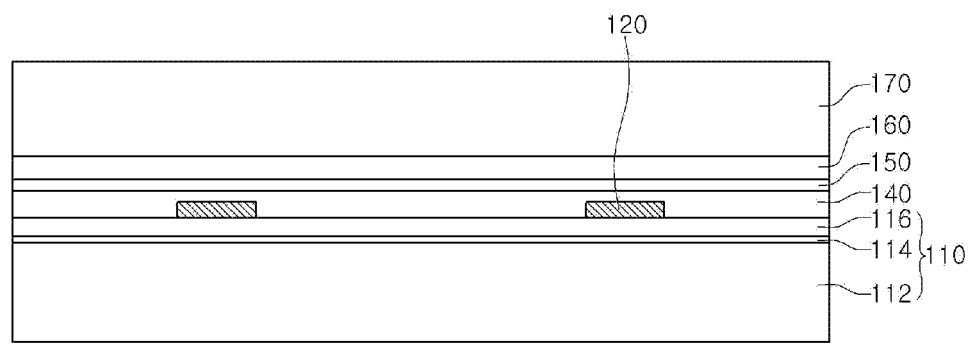

Referring to FIGS. 15 and 16, the substrate 105 may be removed. The substrate 105 may be removed by at least one of a laser lift off (LLO) method, a chemical lift off (CLO) method, and a physical polishing method.

Figure 17:
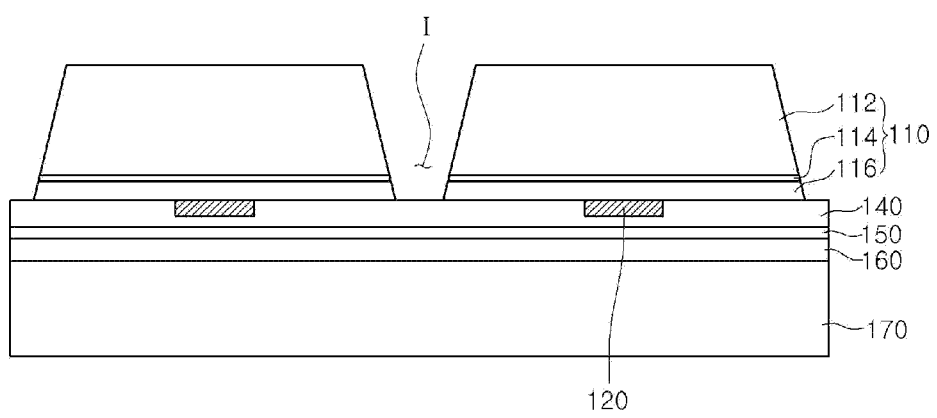

Referring to FIG. 17, an isolation etching process may be performed on the light emitting structure 110 along a chip boundary region I to separate the light emitting structure 110 of the plurality of light emitting devices into individual light emitting device units. However, for convenience of description, a structure in which the light emitting device described in the fabrication process of FIG. 6 turns upside down will be described.

Figure 18:
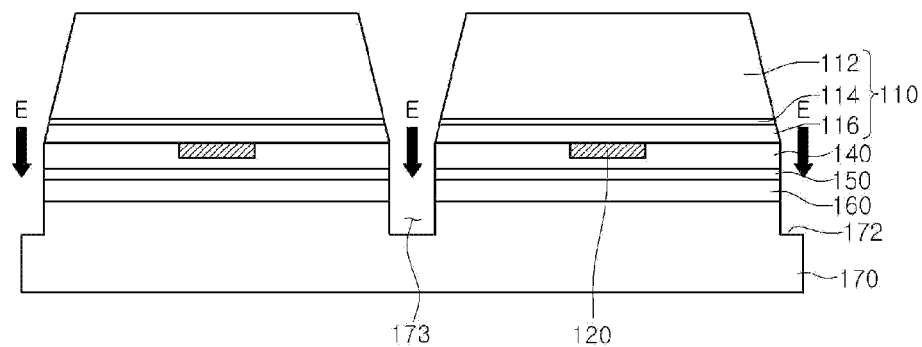

Referring to FIG. 18, an etch process may be performed between the light emitting structures 110 divided into the individual light emitting device unit.

A portion of the channel layer 130, the reflective layer 150, the junction layer 160, and the conductive support member 170 may be removed by the etch process to form a groove 173, and a stepped portion 172 is formed on a side surface of the conductive support member 170. That is, the stepped portion 172 may be formed on a circumference region of the light emitting device 100 according to an embodiment along a chip boundary region.

The top surface of the stepped portion 172 may be spaced from a bottom surface of the light emitting structure 110 by a first distance h. The first distance h may be about 60 μm to about 120 μm.

The etch process may include a wet etch process or a dry etch process, e.g., a dry etch process using inductively couple plasma (ICP).

When the etch process is performed by the wet etch process that is an isotropic etch process, the channel layer 130, the reflective layer 150, the junction layer 160, and the conductive support member 170 may have curved side surfaces.

Figure 19:
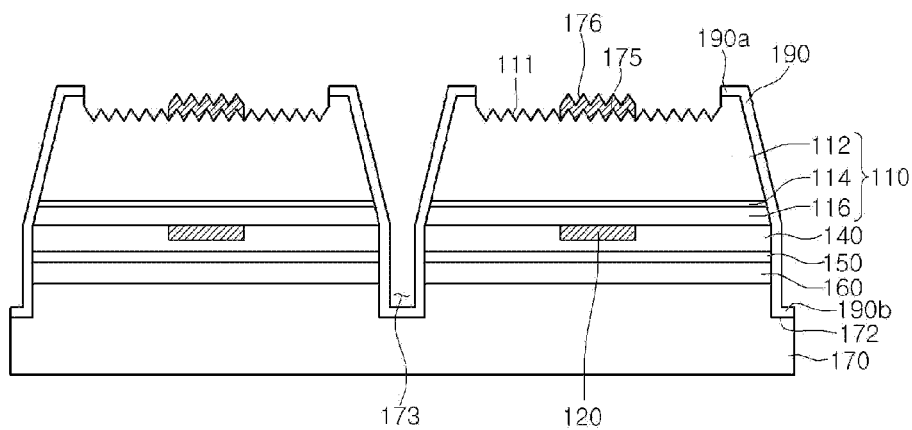
Figure 20:
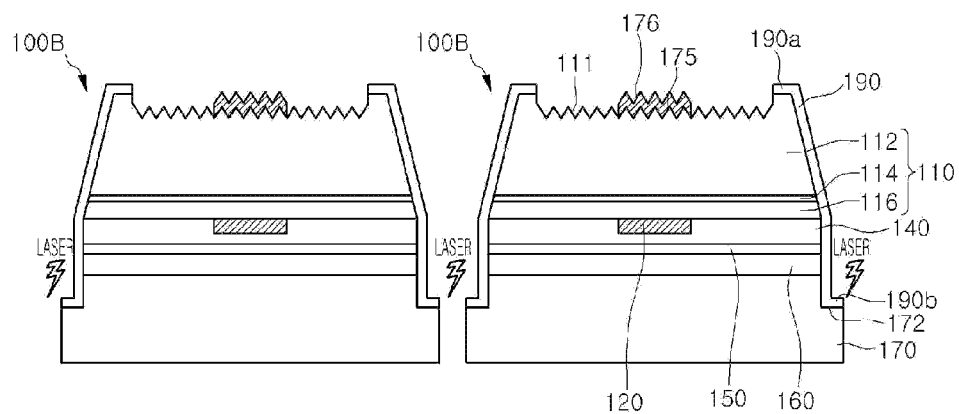

Referring to FIG. 19, an electrode 175 may be formed on the first conductive type semiconductor layer 112. A passivation layer 190 may be formed on side surfaces of the light emitting structure 110 and the conductive support member 170.

Specifically, the second passivation 190 may be formed outside the first passivation layer 180, the channel layer 130, the reflective layer 140, the junction layer 150, and the conductive support member 170.

The second passivation layer 190 may have one end 190a disposed on a top surface of the light emitting structure 110 and the other end 190b disposed on the stopped portion 172 of the conductive support member 170 along the side surface of the light emitting structure 110, but is not limited thereto.

Also, a light extraction structure may be formed on a top surface of the first conductive type semiconductor layer 112.

Figure 21:
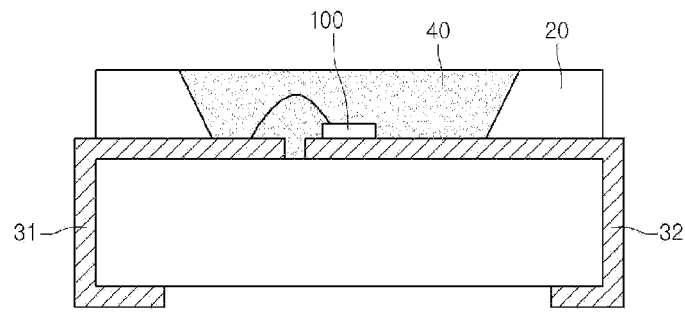
FIG. 21 is a side-sectional view of a light emitting device package including a light emitting device according to an embodiment.

Referring to FIG. 21, a chip separation process using a laser scribing process may be performed along the stepped portion 172 to separate the plurality of light emitting devices into individual light emitting device units, thereby providing the light emitting device 100 according to an embodiment.

The laser scribing process is a process in which a laser is irradiated along a chip boundary to separate chips into unit chip.

In the current embodiment, according to the laser scribing process, since the laser is irradiated onto the stepped portion 172 spaced from the light emitting structure 110 by the first distance h, damage of the light emitting structure 110 due to laser energy in the laser scribing process may be minimized.

Also, according to the laser scribing process, the chip separation process may be quickly performed to improve efficiency of the fabrication process.

FIG. 21 is a side-sectional view of a light emitting device package including a light emitting device 100 according to an embodiment.

Referring to FIG. 21, a light emitting device package according to an embodiment includes a body 10, first and second electrode layers 31 and 32 disposed on the body 10, a light emitting device 100 disposed on the body 10 and electrically connected to the first and second electrode layers 31 and 32, and a molding member 40 surrounding the light emitting device 100 on the body 10.

The body 10 may be formed of a silicon material, a synthetic resin material, or a metal material. An inclined surface may be disposed around the light emitting device 100.

The first electrode layer 31 and the second electrode layer 32 may be electrically separated from each other and provide a power to the light emitting device 100. Also, the first and second electrode layers 31 and 32 may reflect light generated in the light emitting device 100 to improve light efficiency. In addition, the first and second electrode layers 31 and 32 may discharge heat generated in the light emitting device 100 to the outside.

The light emitting device 100 may be disposed on the body 10 or the first or second electrode layer 31 or 32.

The light emitting device 100 may be electrically connected to the first and second electrode layers 31 and 32 using one of a wire method, a flip-chip method, and a die bonding method.

The molding member 40 may surround the light emitting device 100 to protect the light emitting device 100. Also, a phosphor may be contained in the molding member 40 to change a wavelength of light emitted from the light emitting device 100.

Figure 22:
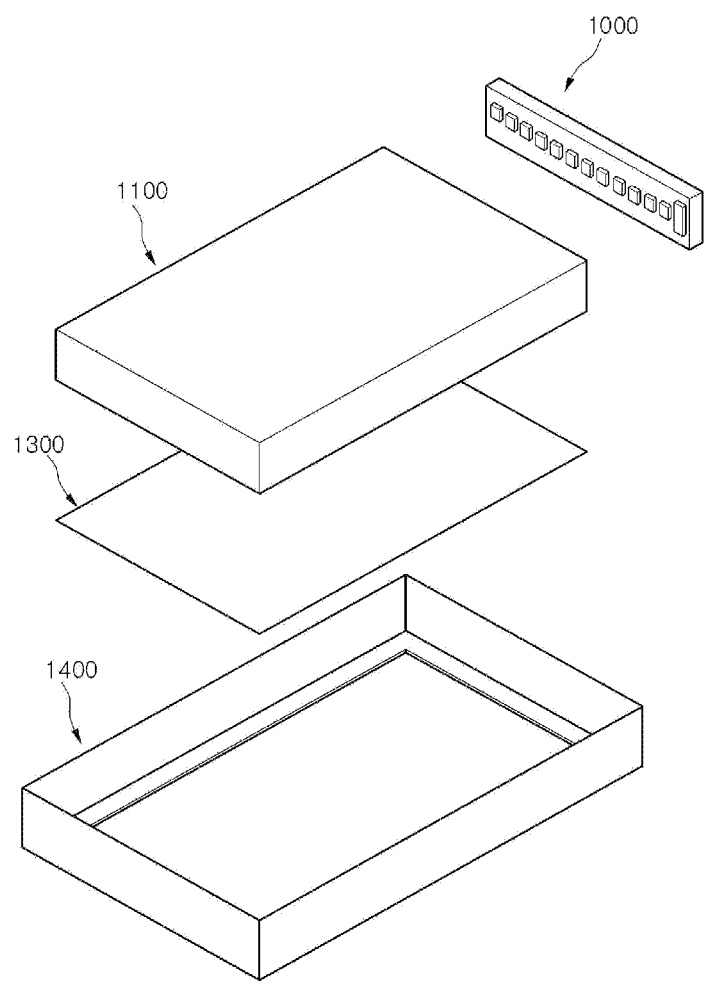
FIGS. 22 and 23 are views of a lighting unit including a light emitting device according to an embodiment.

FIG. 22 is view of a backlight unit using a light emitting device according to an embodiment. The backlight unit of FIG. 22 is an example of a lighting unit, but is not limited thereto.

Referring to FIG. 9, the backlight unit may include a bottom cover 1400, a light guide member 1100 disposed within the bottom cover 1400, and a light emitting module 1000 disposed on at least one surface or an under surface of the light guide member 1100. Also, a reflection sheet 1300 may be disposed below the light guide member 1100.

The bottom cover 1400 may have an upwardly opened box shape to receive the light guide member 1100, the light emitting module 1000, and the reflection sheet 1300. Also, the bottom cover 1400 may be formed of a metal material or a resin material, but is not limited thereto.

The light emitting module 1000 may include a substrate and a plurality of light emitting device packages mounted on the substrate. The plurality of light emitting device packages may provide light to the light guide member 1100.

As shown in FIG. 9, the light emitting module 1000 may be disposed on at least one surface of inner side surfaces of the bottom cover 1400, and thus, the light emitting module 1000 may provide light toward at least one side surface of the light guide member 1100.

Alternatively, the light emitting module 1000 may be disposed on an under surface of the bottom cover 1400 to provide light toward an under surface of the light guide member 1100. This may be variously varied according to a design of the BLU, but is not limited thereto.

The light guide member 1100 may be disposed inside the bottom cover 1400. The light guide member 1100 may receive the light provided from the light emitting module 1000 to produce planar light, and then guide the planar light to a liquid crystal panel (not shown).

When the light emitting module 1000 is disposed on a side surface of the light guide member 1100, the light guide member 1100 may be a light guide panel (LGP).

The light guide plate may be formed of one of a resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

When the light emitting module 100 is disposed on an under surface of the light guide member 1100, the light guide member 1100 may include at least one of the light guide panel or an optical sheet.

For example, the optical sheet may include at least one of a diffusion sheet, a light collection sheet, and a brightness enhancement sheet. For example, the diffusion sheet, the light collection sheet, and the brightness enhancement sheet may be stacked to form the optical sheet. In this case, the diffusion sheet 1150 may uniformly diffuse light emitted from the light emitting module 1000, and the diffused light may be collected into the display panel (not shown) by the light collection sheet. Here, the light emitted from the light collection sheet is randomly polarized light. The bright enhancement sheet may enhance a degree of polarization of the light emitted from the light collection sheet. For example, the light collection sheet may be a horizontal and/or vertical prism sheet. Also, the bright enhancement sheet may be a dual brightness enhancement film.

The reflective sheet 1300 may be disposed below the light guide member 1100. The reflective sheet 1300 may reflects the light emitted through the under surface of the light guide member 1100 toward a light emitting surface of the light guide member 1100.

The reflective sheet 1300 may be formed of a material having superior reflectance, e.g., a PET resin, a PC resin, or a PVC resin, but is not limited thereto.

Figure 23:
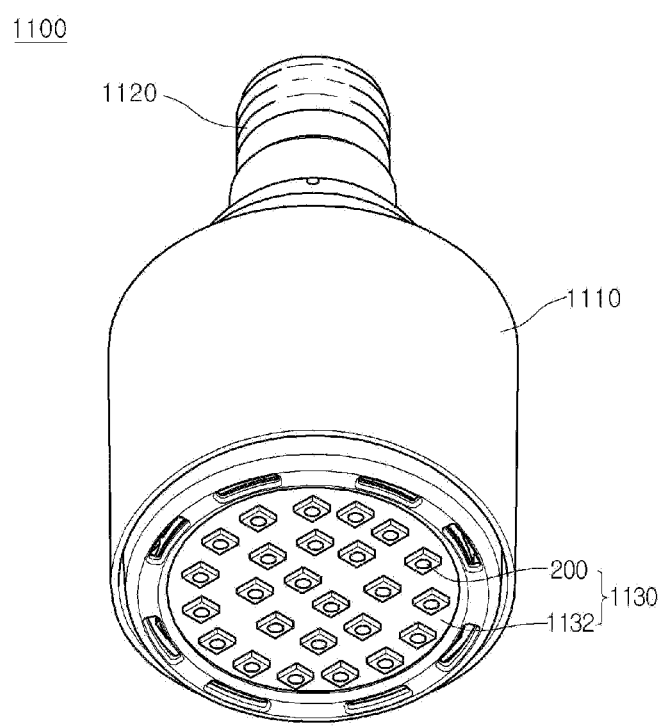

FIG. 23 is a perspective view of a lighting unit 1100 including a light emitting device 200 according to an embodiment. However, the lighting unit is an example of a lighting system, and the present disclosure is not limited thereto.

Referring to FIG. 23, the lighting unit 1100 may include a case body 1110, a light emitting module 1130 disposed on the case body 1110, a connection terminal 1120 disposed on the case body 1210 to receive a power from an external power source.

The case body 1110 may be formed of a material having good thermal dissipation properties, e.g., a metal material or a resin material.

The light emitting module 1130 may include a substrate 1132 and at least one light emitting device package 200 mounted on the substrate 1132.

A circuit pattern may be printed on a dielectric to form the substrate 1132. For example, the substrate 700 may include a printed circuit board (PCB), a metal core PCB, a flexible PCB, and a ceramic PCB.

Also, the substrate 1132 may be formed of an effectively reflective material or have a color on which light is effectively reflected from a surface thereof, e.g., a white color or a silver color.

At least one light emitting device package 200 may be mounted on the substrate 1132. The light emitting device package 200 may include at least one light emitting diode (LED). The LED may include colored LEDs, which respectively emit light having a red color, a green color, a blue color, and a white color and an ultraviolet (UV) LED emitting UV rays.

The light emitting module 1130 may have various combinations of the LED to obtain color impression and brightness. For example, the white LED, the red LED, and the green LED may be combined with each other to secure a high color rendering index.

The connection terminal 1120 may be electrically connected to the light emitting module 1130 to provide a power to the light emitting module 1130. Referring to FIG. 8, the connected terminal 1120 is screw-coupled to an external power source in a socket manner, but is not limited thereto. For example, the connection terminal 1120 may have a pin shape, and thus, be inserted into the external power source. Alternatively, the connection terminal 1120 may be connected to the external power source by a wire.

The embodiments may provide the light emitting device having a new structure, the method for fabricating the light emitting device, the light emitting device package, and the lighting unit.

The embodiments may also provide the light emitting device having improved reliability, the method for fabricating the light emitting device, the light emitting device package, and the lighting unit.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a support member having a stepped portion on a side surface;
   a light emitting structure on the support member, the light emitting structure having a first conductive type semiconductor layer, an active layer, and a second conductive type semiconductor layer, the light emitting structure generating light;

a passivation layer on a side surface of the light emitting structure and a side surface of the support member; and an electrode conducting power to the first conductive type semiconductor layer, wherein the support member has a first surface on which the light emitting structure is disposed and a second surface having an area greater than an area of the first surface, wherein the second surface is on an opposite side of the support member from the first surface, wherein the first surface and the second surface are substantially flat, wherein a width of the first surface is wider than a width of a bottom surface of the light emitting structure, and wherein the passivation layer comprises a first passivation layer extending from a top surface of the light emitting structure to a top surface of a channel layer disposed under the light emitting structure, and a second passivation layer disposed on the first passivation layer and extending from the top surface of the light emitting structure to a surface of the stepped portion of the support member.

2. The light emitting device of claim 1, wherein a top surface of the stepped portion is spaced from a bottom surface of the light emitting structure by a distance of 60 μm to 120 μm.

3. The light emitting device of claim 1, wherein the passivation layer has one end disposed on the light emitting structure and the other end disposed on the stepped portion along the side surfaces of the light emitting structure and the support member.

4. The light emitting device of claim 1, wherein the passivation layer is formed of at least one selected from the group consisting of $SiO_2$, $SiO_x$, $SiO_xN_y$, $Si_3N_4$, and $Al_2O_3$.

5. The light emitting device of claim 1, further comprising a channel layer between the light emitting structure and the support member, the channel layer being disposed along a circumference of a bottom surface of the light emitting structure.

6. The light emitting device of claim 5, wherein the channel layer is formed of at least one selected from the group consisting of $SiO_2$, $Si_xO_y$, $Si_3N_4$, $Si_xN_y$, $SiO_xN_y$, $Al_2O_3$, $TiO_2$, ITO, AZO, ZnO, Ti, Ni, Pt, Pd, Rh, Ir, and W.

7. The light emitting device of claim 1, further comprising at least one of an ohmic layer and a reflective layer between the light emitting structure and the support member.

8. The light emitting device of claim 1, wherein the first and the second passivation layers are formed of the same material.

9. The light emitting device of claim 1, wherein a roughness is disposed on a top surface of the light emitting structure.

10. The light emitting device of claim 1, wherein a roughness is disposed on the electrode.

11. A light emitting device package comprising:
a body;
a first and a second electrode layers on the body; and
a light emitting device of claim 1, the light emitting device being disposed on the body and electrically connected to the first and the second electrode layers to generate light.

12. A lighting system comprising:
a module substrate; and
a light emitting device of claim 1, the light emitting device being mounted on the module substrate.

13. The light emitting device of claim 1, wherein the support member includes a first portion and a second portion disposed below the first portion,
wherein a width of the first portion is wider than a width of the light emitting structure, and
wherein the second portion is protruded outwards from the first portion.

14. The light emitting device of claim 1, wherein the second surface is disposed below the first surface.

15. A light emitting device comprising: a support member having a stepped portion on a side surface; a light emitting structure on the support member, the light emitting structure comprising a first conductive type semiconductor layer, an active layer under the first conductive type semiconductor layer, and a second conductive type semiconductor layer under the active layer, the light emitting structure generating light; a passivation layer on side surfaces of the light emitting structure and the support member; and an electrode conducting power to the first conductive type semiconductor layer, wherein the support member has a first surface on which the light emitting structure is disposed and a second surface having an area greater than an area of the first surface, wherein the second surface is on an opposite side of the support member from the first surface, wherein the first surface and the second surface are substantially flat, wherein a width of the first surface is wider than a width of a bottom surface of the light emitting structure, and wherein an uppermost portion of the passivation layer is disposed higher than an uppermost portion of the first conductive type semiconductor layer, wherein the passivation layer comprises a first passivation layer extending from a top surface of the light emitting structure up to a top surface of a channel layer disposed under the light emitting structure and a second passivation layer disposed on the first passivation layer and extending to a surface of the stepped portion of the support member.

16. A light emitting device comprising: a support member having a stepped portion on a side surface; a light emitting structure on the support member, the light emitting structure comprising a first conductive type semiconductor layer, an active layer under the first conductive type semiconductor layer, and a second conductive type semiconductor layer under the active layer, the light emitting structure generating light; and a passivation layer on side surfaces of the light emitting structure, wherein the support member has a first surface on which the light emitting structure is disposed and a second surface having an area greater than an area of the first surface, and wherein the passivation layer directly contacts an upper surface of the support member and the side surface of the support member, wherein the passivation layer comprises a first passivation layer extending from a top surface of the light emitting structure up to a top surface of a channel layer disposed under the light emitting structure and a second passivation layer disposed on the first passivation layer and extending up to a surface of the stepped portion along the side surface of the support member.

17. The light emitting device of claim 16, wherein a top surface of the stepped portion is spaced from a bottom surface of the light emitting structure by a distance of 60 μm to 120 μm.

18. The light emitting device of claim 16, wherein the channel layer is disposed along a circumference of a bottom surface of the light emitting structure.

* * * * *